US011215674B2

(12) United States Patent
Markochev

(10) Patent No.: US 11,215,674 B2
(45) Date of Patent: Jan. 4, 2022

(54) DETERMINING A STATE OF HEALTH OF A BATTERY AND PROVIDING AN ALERT

(71) Applicant: BBOXX LTD, London (GB)

(72) Inventor: Sergei Markochev, London (GB)

(73) Assignee: BBOXX LTD, London (GB)

( * ) Notice: Subject to any disclaimer, the term of this patent is extended or adjusted under 35 U.S.C. 154(b) by 128 days.

(21) Appl. No.: 16/349,349

(22) PCT Filed: Nov. 17, 2017

(86) PCT No.: PCT/GB2017/053457
§ 371 (c)(1),
(2) Date: May 13, 2019

(87) PCT Pub. No.: WO2018/091904
PCT Pub. Date: May 24, 2018

(65) Prior Publication Data
US 2019/0346513 A1 Nov. 14, 2019

(30) Foreign Application Priority Data

Nov. 17, 2016 (GB) ..................... 1619484

(51) Int. Cl.
*G01R 31/392* (2019.01)
*G01R 31/3842* (2019.01)
(Continued)

(52) U.S. Cl.
CPC ......... *G01R 31/392* (2019.01); *G01R 31/367* (2019.01); *G01R 31/371* (2019.01); *G01R 31/3842* (2019.01); *G01R 31/379* (2019.01)

(58) Field of Classification Search
CPC ............. G01R 31/392; G01R 31/3842; G01R 31/367; G01R 31/371; G01R 31/379; G01R 31/3828; G01R 19/2509; G01R 19/2513
See application file for complete search history.

(56) References Cited

U.S. PATENT DOCUMENTS

2003/0204328 A1* 10/2003 Tinnemeyer ......... G01R 31/382
702/30
2008/0054848 A1 3/2008 Yun et al.
(Continued)

FOREIGN PATENT DOCUMENTS

DE 10 2013 215894 A1 2/2014
EP 2 980 596 A1 2/2016
(Continued)

OTHER PUBLICATIONS

International Search Report and Written Opinion of the International Searching Authority dated Jan. 22, 2018 in corresponding International application No. PCT/GB2017/053457; 11 pages.
(Continued)

*Primary Examiner* — Tarun Sinha
*Assistant Examiner* — Yossef Korang-Beheshti
(74) *Attorney, Agent, or Firm* — Maier & Maier, PLLC

(57) ABSTRACT

A computer-implemented method including: receiving a set of data from a battery, the set of data including battery voltage and current data obtained over a period of time; preparing a plurality of subsets of the set of data, wherein each subset corresponds to a subperiod of the period of time; determining a state of health of the battery versus time by fitting a battery model to the subsets, where the parameters of the battery model include a state of charge of the battery at a particular point of time in each subperiod and the state of health, wherein the time dependence of the state of health is controlled thereby limiting the magnitude of the temporal rate of change of the state of health; and providing an alert in response to the state of health meeting a particular criterion.

17 Claims, 8 Drawing Sheets

(51) Int. Cl.
  *G01R 31/367* (2019.01)
  *G01R 31/371* (2019.01)
  *G01R 31/379* (2019.01)

(56) References Cited

U.S. PATENT DOCUMENTS

| | | | |
|---|---|---|---|
| 2009/0109046 A1* | 4/2009 | Gielniak | G01R 31/392 340/636.12 |
| 2010/0244846 A1* | 9/2010 | Desprez | G01R 31/392 324/427 |
| 2014/0049226 A1 | 2/2014 | Mao | |
| 2014/0333265 A1 | 11/2014 | Kinjo et al. | |
| 2015/0303533 A1 | 10/2015 | Osaka et al. | |
| 2015/0349385 A1* | 12/2015 | Hu | H01M 10/48 429/91 |
| 2016/0033582 A1 | 2/2016 | You et al. | |
| 2016/0161567 A1 | 6/2016 | Park | |
| 2016/0221465 A1 | 8/2016 | Kratzer et al. | |
| 2016/0231386 A1 | 8/2016 | Sung et al. | |
| 2017/0023649 A1* | 1/2017 | You | G01R 31/3842 |
| 2017/0328957 A1* | 11/2017 | Suzuki | H01M 10/482 |
| 2018/0024200 A1 | 1/2018 | Hiwa | |

FOREIGN PATENT DOCUMENTS

| | | |
|---|---|---|
| EP | 3 050 739 A1 | 8/2016 |
| JP | 2011-208966 A | 10/2011 |
| JP | 2014-074686 A | 4/2014 |
| WO | 2013/145734 A1 | 10/2013 |
| WO | 2016/129248 A | 8/2016 |

OTHER PUBLICATIONS

GB Search Report under Section 17 dated Mar. 29, 2017 in corresponding UK patent application No. 1619484.7; 3 pages.

Gould, et al., "New Battery Model and State-of-Health Determination Through Subspace Parameter Estimation and State-Observer Techniques", IEEE Transactions on Vehicular Technology, Oct. 2009, p. 3905-3916, vol. 58, No. 8; 12 pages.

Byrd, et al., "A Limited Memory Algorithm for Bound Constrained Optimization", SIAM Journal on Scientific and Statistical Computing, 1995, p. 1190-1208; 25 pages. Available from: http://users.iems.northwestern.edu/~nocedal/PDFfiles/limited.pdf [Accessed Mar. 24, 2017].

Plett, "Extended Kalman filtering for battery management systems of LiPB-based HEV battery packs. Part 2. Modeling and identification", Journal of Power Sources, 2004, p. 262-276, vol. 134; 16 pages.

Office Action dated Aug. 24, 2021 in corresponding Japanese Application No. 2019-547791; 11 pages including English-language translation.

* cited by examiner

DETERMINING A STATE OF HEALTH OF A BATTERY AND PROVIDING AN ALERT

FIELD

The present application relates among other things to a computer-implemented method comprising determining a state of health of a battery.

BACKGROUND

Rechargeable batteries have very many uses, including, for example, in off-grid solar power systems. It is useful to understand how the performance of such batteries changes with time. Among other things, this may enable the batteries to be more effectively managed and maintained.

The state of health of a battery (Soli) may be defined as the ratio of a present capacity of a battery to a nominal capacity. Typically, SoH is initially around 100% and decreases with time—for instance by several % per month. The state of charge of a battery (SoC) may be defined as the ratio of an amount of charge in a battery to the present capacity. There are various known techniques for measuring SoC while a battery is in use, i.e. "online". Several of these techniques involve among other things integrating the current in or out of the battery, i.e. "coulomb counting".

Plett, G., Extended Kalman filtering for battery management systems of LiPB-based HEV battery packs. Part 2. Modeling and identification, Journal of Power Sources 134 (2004) 262-276 describes a method for estimating values including SoC and capacity fade based on extended Kalman filtering and on a mathematical model that includes terms that describe the dynamic contributions due to open-circuit voltage, ohmic loss, polarization time constants, electrochemical hysteresis and the effects of temperature.

Gould, C. R. et al, New Battery Model and State-of-Health Determination Through Subspace Parameter Estimation and State-Observer Techniques, IEEE Transactions on Vehicular Technology, 58 (2009) 3905-3916 describes an adaptive battery model based on a remapped variant of the Randles' lead-acid model, which is used with subspace parameter-estimation techniques to identify and converge on voltages associated with SoC. Observation of these voltages, as well as online monitoring of the degradation of the estimated dynamic model parameters, allows battery aging (SoH) to also be assessed.

SUMMARY

According to a first aspect of the present invention, there is provided a computer-implemented method comprising:
receiving a set of data from a battery, the set of data comprising battery voltage and current data obtained over a period of time;
preparing a plurality of subsets of the set of data, wherein each subset corresponds to a subperiod of the period of time;
determining a state of health of the battery (SoH) versus time by fitting a battery model to the subsets, wherein the parameters of the battery model comprise:
a state of charge of the battery (SoC) at a particular point of time in each subperiod (e.g. at the beginning of each subperiod); and
SoH, wherein the time dependence of SoH is controlled thereby limiting the magnitude of the temporal rate of change of SoH; and providing an alert in response to SoH meeting a particular criterion.

Thus, the method may provide an effective and efficient way of determining SoH from battery voltage and current data and alerting e.g. a system or person appropriately. An alert may be provided if, for example, SoH is below a particular value or is predicted to go below a particular value. As will be appreciated, alerts may be used, for example, by a battery management system to manage use of the battery, for example to limit depth of discharge. Alternatively or additionally, alerts may be used e.g. to prompt battery replacements to avoid battery failures.

The method may be carried out by apparatus such as a computer server system. The battery may be located remotely from e.g. the computer server system. The battery may comprise apparatus to send the set of data (or otherwise enable the set of data to be provided) to e.g. the computer server system. The set of data may be received via a communications network or in any other suitable way. The set of data may be received gradually, e.g. in substantially real time, or in one or more separate parts, e.g. corresponding to data obtained in the (recent) past.

The battery may be one of a plurality of batteries, e.g. tens of thousands or more batteries.

The period of time may be, for example, several months.

The battery voltage may correspond to a voltage across the terminals of the battery. The battery current may correspond to a current flowing in or out of the battery (e.g. during charging or discharging, respectively). The battery may comprise apparatus to obtain the battery voltage and current data. The set of data may include data (e.g. timestamps) enabling the time at which the battery voltage and current data were obtained. The set of data may include additional data relating to the battery.

As will be explained in more detail below, the time dependence of SoH may be controlled by making SoH a suitable function of time.

Preparing the subsets may comprise selecting points with a higher density where the battery current is higher. Preparing the subsets may comprise selecting points with a higher density where the battery voltage is further from a characteristic (e.g. an average) battery voltage.

These selected points ("smart points") may provide more information about the condition of the battery than non-selected points. Thus, the amount of data to be processed may be reduced thereby improving performance, while seeking to maximise the accuracy with which SoH is determined.

Preparing the subsets may comprise preparing the subsets such that each of the subsets corresponds to a discharge of the battery.

Thus, since at least one of the parameters of the battery model may relate (only) to charging of the battery, the number of parameters used to determine SoH may be advantageously reduced.

Preparing the subsets may comprise selecting subsets corresponding to a discharge of at least a predetermined size. The predetermined size may correspond to a predetermined proportion, e.g. 10%, of a nominal capacity of the battery.

The method may comprise preferentially selecting subsets corresponding to larger discharges. Preferentially selecting subsets may comprise giving a score to each subset and selecting subsets with higher scores.

A larger discharge may provide more information about the state of the battery than a smaller discharge.

The method may comprise preferentially selecting subsets that are more uniformly spaced from each other.

More uniformly spaced subsets may enable SoH versus time to be determined more effectively and efficiently. This may be especially useful where SoH versus time is described by a spline function (see below).

Determining SoH versus time may comprise determining a set of parameters describing SoH as a function of time.

The function describing the time dependence of SoH may correspond to a spline, for example a cubic spline.

Thus, the function may be suitably smooth and suitably detailed.

The battery model may predict the relationship between battery voltage and current. For example, the battery model may produce a predicted battery voltage corresponding to a measured battery current, and the predicted battery voltage may be compared with the corresponding measured battery voltage.

Fitting the battery model to the subsets may comprise minimising an error associated with predictions of the battery model using an optimization algorithm.

The battery model may use a constant SoH for fitting a particular subset.

The battery model may use coulomb counting for fitting a particular subset.

The battery model may not require that the subsets comprise open-circuit-voltage data.

The parameters of the battery model may comprise a set of ("first") parameters of a ("first") function describing inaccessible capacity of the battery as a function of battery current.

The inaccessible capacity of the battery may be defined as the amount of theoretically-available charge/capacity that is not accessible for either charging or discharging at a given (non-zero) current.

As explained in more detail below, the inaccessible capacity may be normalised (in a similar way to SoC) by the present theoretically-available capacity (e.g. capacity at a discharge current of ~0). The normalised inaccessible capacity may be denoted by the symbol $\tilde{C}$. The first function may involve $\tilde{C}$.

The depth of charge (DoC) of the battery may be defined as SoC-$\tilde{C}$ (when the battery is discharging) and SoC+$\tilde{C}$ (charging). For discharging, SoC may be described as representing the theoretically-available charge (e.g. charge available at a discharge current of ~0), and DoC may be described as representing the charge actually available at a given (non-zero) discharge current.

At least some of the first parameters may be constant (e.g. may not change with time). At least some of the first parameters may be predetermined, for example based on capacity-versus-discharge-current data obtained for batteries of the same or similar type.

The parameters of the battery model may comprise a set of ("second") parameters of a ("second") function relating battery voltage to DoC.

At least some of the second parameters may be constant. At least some of the second parameters may be different for different batteries. Accordingly, as will be explained in more detail below, at least some of the second parameters may be determined by fitting the battery model to the subsets. At least some of the second parameters may be different depending upon whether the battery is charging or discharging.

The second function may comprise a double logarithmic function.

The second function may include a relaxation-time correction, wherein the correction may only apply at low currents.

The battery model may also comprise parameters such as a nominal capacity of the battery (which may be denoted by the symbol $C_0$) at a particular discharge current and this discharge current (which may be denoted by the symbol $I_0$).

Fitting the battery model to the subsets may comprise:
using an inner loop to determine at least the states of charge at the particular points of time (SoCs); and
using an outer loop to determine at least SoH versus time.

Thus, the optimisation algorithm may converge more effectively.

The SoCs may freely vary between subsets, whereas SoH generally may not.

Using the outer loop may comprise determining at least some of the other parameters of the battery model, for example at least some of the second parameters (see above).

Using the outer loop may comprise determining a structure of a function describing the time dependence of SoH, for example the number and position of spline knots.

The method may comprise:
determining a set of parameters describing SoH as a function of time using a particular number of initial subsets; and then
updating the parameters using at least one further subset.

Thus, the method may accurately determine SoH as a function of time when starting with any number of subsets.

The method may comprise re-starting the determination of SoH versus time (e.g. re-initialising parameters) in response to a predetermined criterion. The predetermined criterion may be that there is a significant increase in SoH versus time (e.g. that a derivative of SoH versus time exceeds a predetermined value). In this way, the method may detect that a battery has been replaced, and further action may be taken in response to this. The predetermined criterion may be that a predetermined amount of time (e.g. a number of months) has elapsed since the battery voltage and current data was last received. Thus, errors which can accumulate with time may be avoided.

The method may comprise determining SoC versus time by using a particle filter (or equivalent) to fit the battery model to at least part of the set of data using the parameters of the battery model that were determined by fitting the battery model to the subsets.

Thus, SoC versus time may be determined for times other than merely the subperiods of time. For example, SoC may be determined for data corresponding to charging of the battery and/or for data corresponding to non-selected discharges. SoC may be determined for the whole of the period of time over which the set of data was obtained.

Using the particle filter may comprise using SoH versus time data that was determined by fitting the battery model to the subsets. SoH may be determined at any particular time, for example using the parameters describing SoH as a function of time and/or by interpolation.

Using the particle filter may comprise determining at least one parameter of the battery model that is related to charging of the battery (e.g. one of the second parameters, see above).

The method may comprise providing an alert in response to SoC versus time meeting a particular criterion.

Thus, particular conditions of the battery, e.g. a charging problem, may be identified and acted upon.

There may be provided a computer program for performing the method. There may be provided a non-transitory computer-readable medium comprising the computer program.

According to a second aspect of the present invention, there is provided apparatus configured to perform the method.

The apparatus may comprise at least one processor and at least one memory comprising computer program code, the at least one memory and the computer program code configured to, with the at least one processor, cause the apparatus to perform the method.

There may be provided a system comprising:
the apparatus;
one or more batteries; and
a communications network configured to enable the apparatus to receive a set of data from each of the batteries.

BRIEF DESCRIPTION OF THE DRAWINGS

Certain embodiments of the present invention will now be described, by way of example, with reference to the accompanying drawings, in which.

DETAILED DESCRIPTION

System

Figure 1:
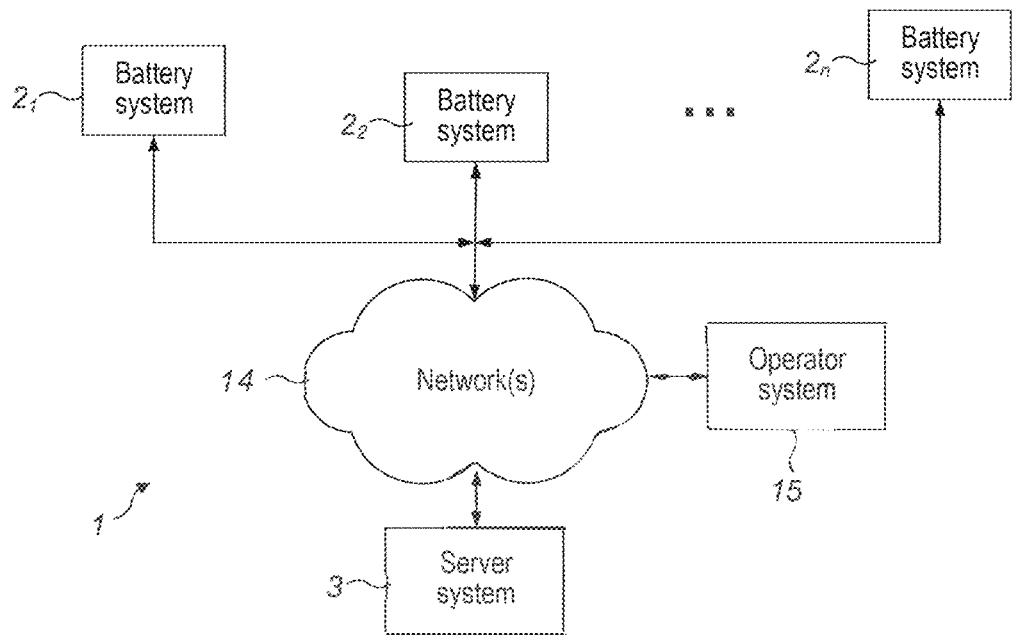
FIG. 1 illustrates a system.

Referring to FIG. 1, a system 1 will now be described. The system 1 includes a plurality of battery systems $2_1, \ldots, 2_n$ and a computer server system 3 (hereinafter referred to as simply a server). Each battery system 2 communicates with the server 3 via one or more of a set of communications networks 14 which may include a mobile telephone (i.e. cellular) network and the internet. The system 1 includes a further computer system 15 (hereinafter referred to as an operator system), which also communicates with the server 3 via one or more of the set of communications networks 14.

Battery System

Figure 2:
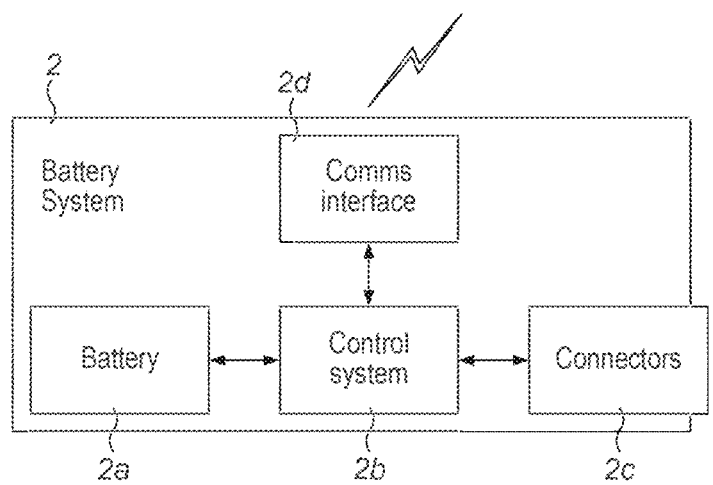
FIG. 2 illustrates a battery system which may be part of the system of FIG. 1.

Referring to FIG. 2, a typical battery system 2 will now be described. The battery system 2 includes a rechargeable battery 2a (hereinafter referred to as simply a battery), a control system 2b, a set of connectors 2c and a communications interface 2d.

The battery 2a includes a lead acid battery or another suitable type of battery. The connectors 2c include connectors for receiving electrical power for charging the battery 2a. The received electrical power may be provided by a solar panel (not shown). The connectors 2c also include connectors for providing electrical power from the battery 2a to other devices such lights, portable electronic devices, etc. (not shown).

The connectors 2c are connected to the battery 2a via the control system 2b. The control system 2b measures the voltage across the terminals of the battery 2a (i.e. "the battery voltage") and the current flowing in or out of the battery 2a (i.e. "the battery current"). The measurements are made repeatedly, e.g. at regular intervals. The control system 2b may determine a date and time associated with each measurement (hereinafter referred to as a timestamp). The control system 2b sends data including the battery voltages, the battery currents and the timestamps to the server 3 via the communications interface 2d and the communications networks 14. The data may be sent in substantially real time, in which case there need not be timestamps, or may be stored and sent in batches.

The control system 2b may also control the rate of charging/discharging of the battery 2a, the extent of charging/discharging of the battery 2a, etc. The control system 2b may receive commands and/or other data from the server 3 and may modify its operations based on the received commands/data.

Server

Figure 3:
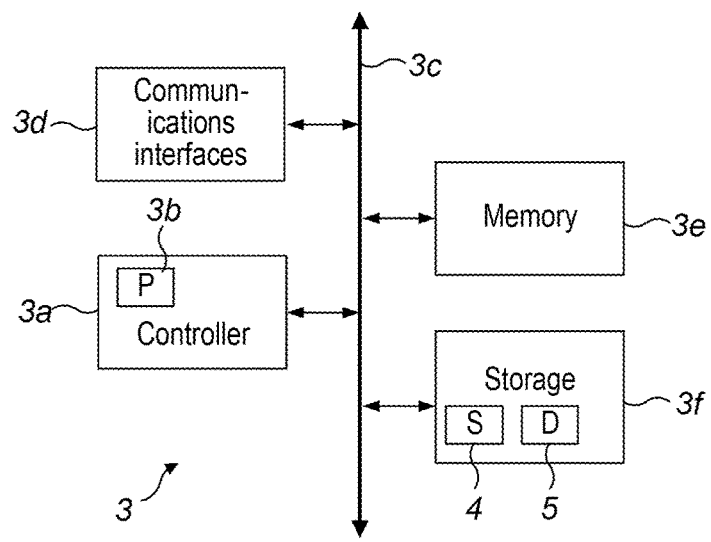
FIG. 3 illustrates a server which may be part of the system of FIG. 1.

Referring to FIG. 3, the server 3 will now be described in more detail. The server 3 includes a controller 3a which includes one or more processors 3b (denoted by "P" in the figure). The controller 3a communicates with other components of the server 3 via a system bus 3c. The server 3 includes one or more communications interfaces 3d (e.g. an Ethernet interface) for communicating via one or more of the set of communications networks 14. The server 3 includes memory 3e including volatile memory, e.g. RAM, and non-volatile memory, e.g. ROM. The volatile memory is used by the controller 3a for the temporary storage of data, for instance when controlling the operation of other components of the server 3 or moving data between components. The server 3 includes storage 3f, e.g. solid state and/or hard disk storage. The storage 3f stores, among other things, computer-readable instructions 4 (hereinafter referred to as server software) used in operating the server 3 and data 5 (hereinafter referred to as server data) used in relation to the server software 4 (the server software 4 and server data 5 are denoted by "S" and "D", respectively, in the figure).

Figure 4:
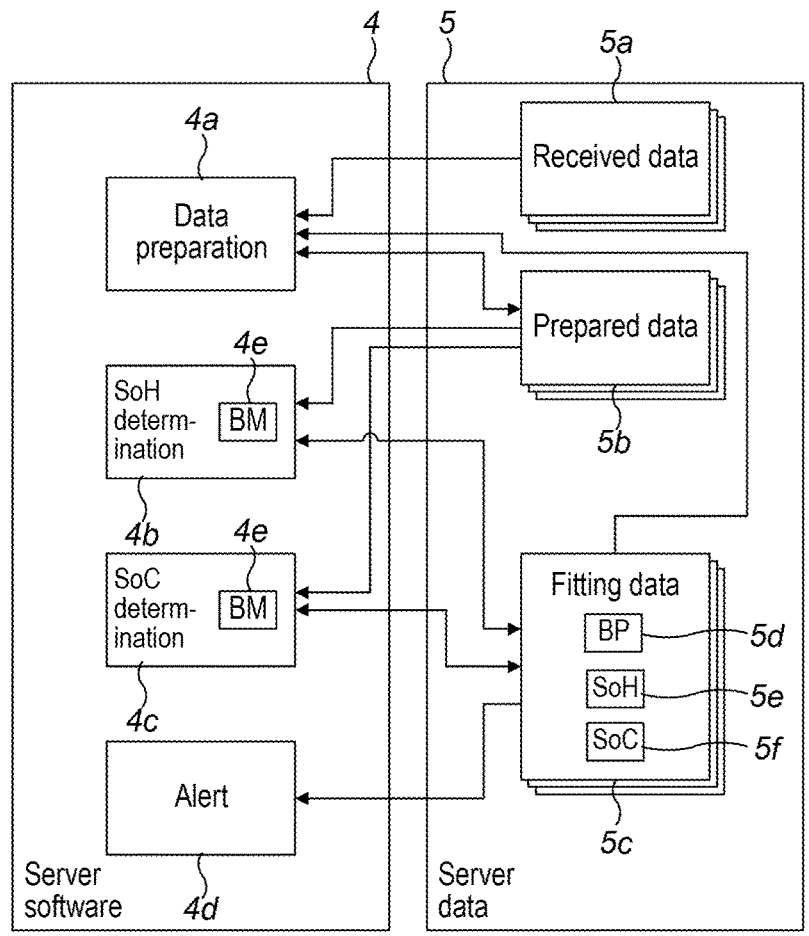
FIG. 4 illustrates software and data associated with the server of FIG. 3.

Referring to FIG. 4, the server software 4 and the server data 5 will now be described in more detail. The server software 4 includes a data preparation module 4a, a state of health (SoH) determination module 4b, a state of charge (SoC) determination module 4c, an alert module 4d and a battery model 4e (denoted by "BM" in the figure). The term "module" is merely used for convenience to refer to a part or parts of the server software 4 which may (together) have a particular function. The server data 5 includes received data 5a, prepared data 5b, and fitting data 5c. The fitting data 5c includes battery parameters 5d (denoted by "BP" in the figure), SoH data 5e, and SoC data 5f. As illustrated in the figure, there may be a plurality of sets of received data 5a, prepared data 5b and fitting data 5c, one for each battery system 2.

As will be explained in more detail below, the data preparation module 4a takes received data 5a (and, in some examples, certain fitting data 5c) and provides prepared data 5b for use by the SoH and SoC determination modules 4b, 4c. For each battery system 2, the SoH determination module 4b takes prepared data 5b and certain fitting data 5c, and provides certain (updated) fitting data 5c, including SoH data 5e. For each battery system 2, the SoC determination module 4c takes prepared data 5b and certain fitting data 5c, including the SoH data 5e provided by the SoH determination module 4b, and provides certain (updated) fitting data 5c, including SoC data 5f. Both the SoH determination module 4b and the SoC determination module 4c utilise the battery model 4e. The alert module 4d takes certain fitting data 5c, particularly the SoH data 5e and/or the SoC data 5f, and selectively provides alerts.

The server software 4 and/or the server data 5 may include additional features not shown in the figure. For example, the server software 4 may include a module for presenting, via a user interface, information relating to the SoH data 5e and/or the SoC data 5f.

Method

Figure 5:
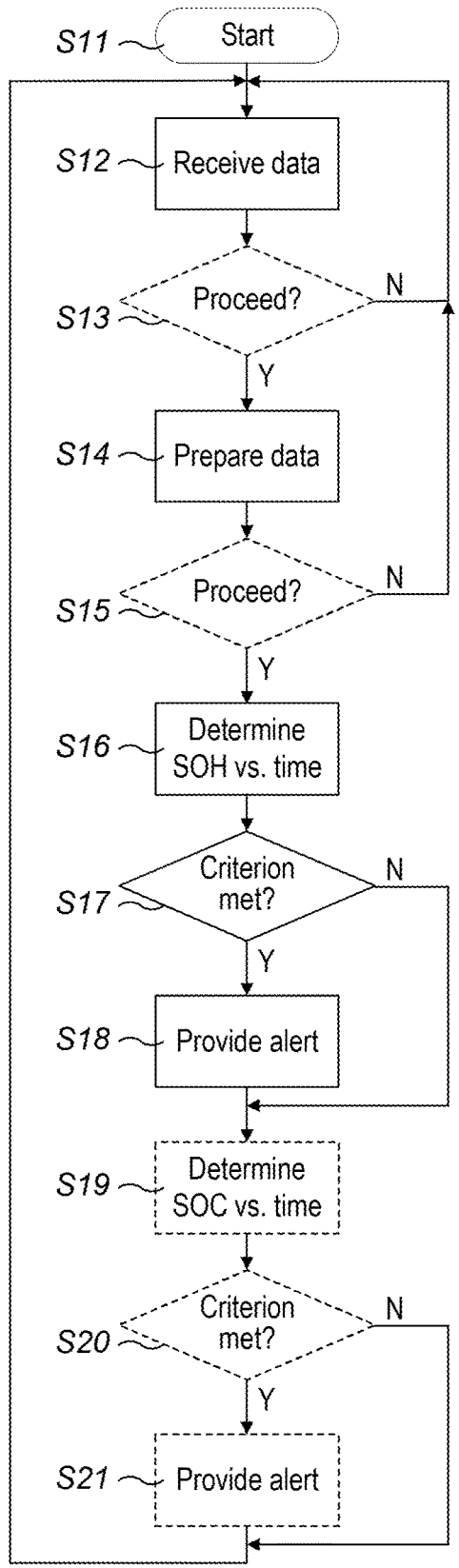
FIG. 5 illustrates a method which may be performed by the server of FIG. 3.

Referring to FIG. 5, a method which may be performed by the server 3 will now be described.

At a first step S11, the server 3 starts to perform the method, e.g. in response to a command received from the operator system 5.

At a second step S12, the server 3 receives data. In particular, the server 3 receives data from one or more of the battery systems $2_1, \ldots, 2_n$. Data received from a particular battery system 2 preferably includes data identifying the battery system 2. The server 3 preferably stores the data received at the second step S12 as received data 5a.

The received data 5a includes a number of data points for one or more of the battery systems $2_1, \ldots, 2_n$. Each data point includes a battery voltage value ($V_i$), a battery current value ($I_i$) and a timestamp ($t_i$).

At an optional third step S13, the server 3 determines whether to proceed to a fourth step S14. The server 3 proceeds to the fourth step S14 if, for example, the received data 5a for one of the battery systems $2_1, \ldots, 2_n$ (hereinafter referred to as the relevant battery system 2) meets one or more criteria, e.g. at least a particular number of new data points has been received. If not, then the server 3 returns to the second step S12 to receive further data.

At the fourth step S14, the server 3 (i.e. the data preparation module 4a) prepares received data 5a for the relevant battery system 2. As will be explained in more detail below, this involves selecting data points and selecting groups of data points (hereinafter also referred to as subsets). The server 3 stores the data prepared at the fourth step S14 as prepared data 5b.

At an optional fifth step S15, the server 3 determines whether to proceed to a sixth step S16. In particular, the server 3 proceeds to the sixth step S16 if, for example, the prepared data 5b for the relevant battery system 2 meets one or more criteria, e.g. the number of (complete) subsets exceeds a particular number. As will be explained in more detail below, an SoH curve is preferably described by a cubic spline, which has at least four spline coefficients and so the minimum number of subsets is four. If not, then the server 3 returns to the second step S12 to receive further data.

At the sixth step S16, the server 3 (i.e. the SoH determination module 4b) determines SoH versus time (hereinafter also referred to as an SoH curve) for the relevant battery system 2. As will be explained in more detail below, this involves fitting a plurality of subsets 5b using the battery model 4e. The server 3 stores the SoH curve and/or parameters describing the SoH curve as SoH data 5e.

At a seventh step S17, the server 3 (i.e. the alert module 4d) determines whether the SoH curve for the particular battery system 2 meets a particular criterion. In some examples, the criterion corresponds to SoH being below a particular value or being predicted to go below a particular value. If so, then the server 3 proceeds to an eighth step S18. If not, then the server 3 proceeds to a ninth step S19.

At the eighth step S18, the server 3 (i.e. the alert module 4d) provides an alert. In some examples, the server 3 sends a message to the operator system 5 (via the communications interface 3d and one or more of the set of communications networks 4) and this message may be provided to a user via a user interface of the operator system 5. In some examples, the server 3 may take alternative or additional actions, e.g. sending suitable commands to the relevant battery system 2 to modify its operations.

At the optional ninth step S19, the server 3 (i.e. the SoC determination module 4c) determines SoC versus time for the relevant battery system 2. In particular, as will be explained in more detail below, the server 3 uses a particle filter to fit the battery model 4e to some or all of the received data 5a for the relevant battery system 2. The server 3 stores SoC data 5f.

At an optional tenth step S20, the server 3 (i.e. the alert module 4d) determines whether SoC versus time for the relevant battery system 2 meets a particular criterion, as will be explained in more detail below. If so, then the server 3 proceeds to an eleventh step S21. If not, then the server 3 returns to the second step S12 to receive more data.

At the optional eleventh step S21, the server 3 (i.e. the alert module 4d) provides an alert, e.g. by sending a message to the operator system 5. The server 3 then returns to the second step S12 to receive more data.

Data Preparation

Figure 6:
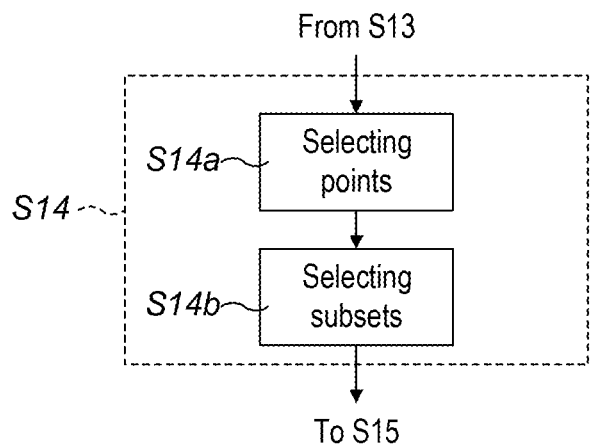
FIG. 6 illustrates the data preparation step of the method of FIG. 5 in more detail.

Referring to FIG. 6, the fourth ("data preparation") step S14 will now be described in more detail.

At a first sub-step S14a, the server 3 (i.e. the data preparation module 4a) selects certain data points from the data points that constitute the (newly) received data 5a for the relevant battery system 2. The selected data points may also be referred to herein as smart points.

In this way, the server 3 seeks to increase performance of the SoH and SoC determination modules 4b, 4c by reducing the amount of data to be inputted to these modules.

The server 3 selects smart points in the most useful areas of the received data 5a, i.e. areas which provide more information about the condition of the battery 2a in the relevant battery system 2 (hereinafter also referred to as simply the battery). For example, the server 3 may select smart points with a higher density where the current in or out of the battery is higher. This may be achieved, for example, by determining, for each data point, a cumulative time ("t_sum") and a cumulative charge transferred ("charge_sum") since the previous smart point. Here, charge_sum may be determined as the sum of the charges transferred between successive pairs of data points. The charge transferred between a successive pair of data points may be determined as the product of the time between the data points and the battery current at e.g. the later of the two data points. A data point may be selected as a smart point if the following condition is satisfied:

$$t\_sum > A \exp(-B \times charge\_sum) \tag{Eq. 1}$$

where, for example, if t_sum is in minutes and charge_sum is in ampere hours, typical values for the parameters A and B may be ~500 and 5, respectively.

Also, the server 3 may select smart points with a higher density where the battery voltage is further from a characteristic (e.g. an average) battery voltage. For example, a data point may be selected as a smart point if the following condition is satisfied:

$$t\_sum > A(1 + \max(0, (V_{mean} - V_i)/V_{sd}) \exp(-B \times charge\_sum))) \quad \text{(Eq. 2)}$$

where A and B are as above, $V_i$ is the battery voltage at the data point, and $V_{mean}$ and $V_{sd}$ are the mean and standard deviation of the battery voltage over a particular time interval, e.g. an appropriate subperiod.

At a second sub-step S14b, the server 3 prepares groups of smart points, i.e. subsets, for use in determining SoH. Each subset corresponds to a (e.g. non-overlapping) subperiod of the period of time over which the received data 5a was measured.

Each subset preferably corresponds to a discharge of the battery. As will be explained in more detail below, this reduces by one the number of fitting parameters when determining SoH. It also eliminates errors associated with charging inefficiency.

Each subset/discharge also preferably meets some or all of the following requirements:
the subsets cannot contain large time gaps between successive data points;
the subsets must correspond to a discharge of at least a predetermined size, e.g. a change in SoC ($\Delta$SoC) of at least 10% of the nominal capacity ($C_0$) (The larger $\Delta$SoC, the more valuable the discharge is for determining SoH. As will be explained in more detail below, the SoH curve may be described using a cubic spline. In this case, different discharges complement each other and so, even if each $\Delta$SoC is just 10% of $C_0$, the battery model parameters are estimated based on the overall $\Delta$SoC which may be much larger);
the time gaps between subsets should be as uniform as possible (as this affects the spline shape)—to achieve this, each subset is given a score depending on its timestamp (e.g. date) in relation to others as well as on its depth of discharge.

In examples in which SoH versus time is described by a spline function, the scores may be given to the subsets as follows:

At each iteration, a subset may be selected from those subsets that are positioned between a pair of successive knots of the spline function. The pairs of knot may be internal knots and/or the first and/or last knot of the spline.

The score ($w_i$) for each such subset may be calculated using:

$$w_i = \max_j s_i e^{-(\frac{t_i - t_j}{\sigma})^2} \quad \text{(Eq. 3a)}$$

$$s_i = \frac{\Delta Q_i}{C_0} + \frac{\Delta V_i}{\Delta V_{max}} \quad \text{(Eq. 3b)}$$

$$\sigma = \frac{\sqrt{2}(t_1 - t_0)}{3N} \quad \text{(Eq. 3c)}$$

wherein $s_i$ is the non-positional score for the subset, which is determined e.g. using its depth of discharge ($\Delta Q_i$) and voltage range $\Delta V_i$ divided by a parameter $\Delta V_{max}$ (=1.5 volts for instance); $t_i$ is a timestamp associated with the subset; and $\{t_j\}$ is a set of N equally-spaced timestamps between the first knot (with timestamp $t_0$) and second knot (with timestamp $t_1$).

Figure 7:
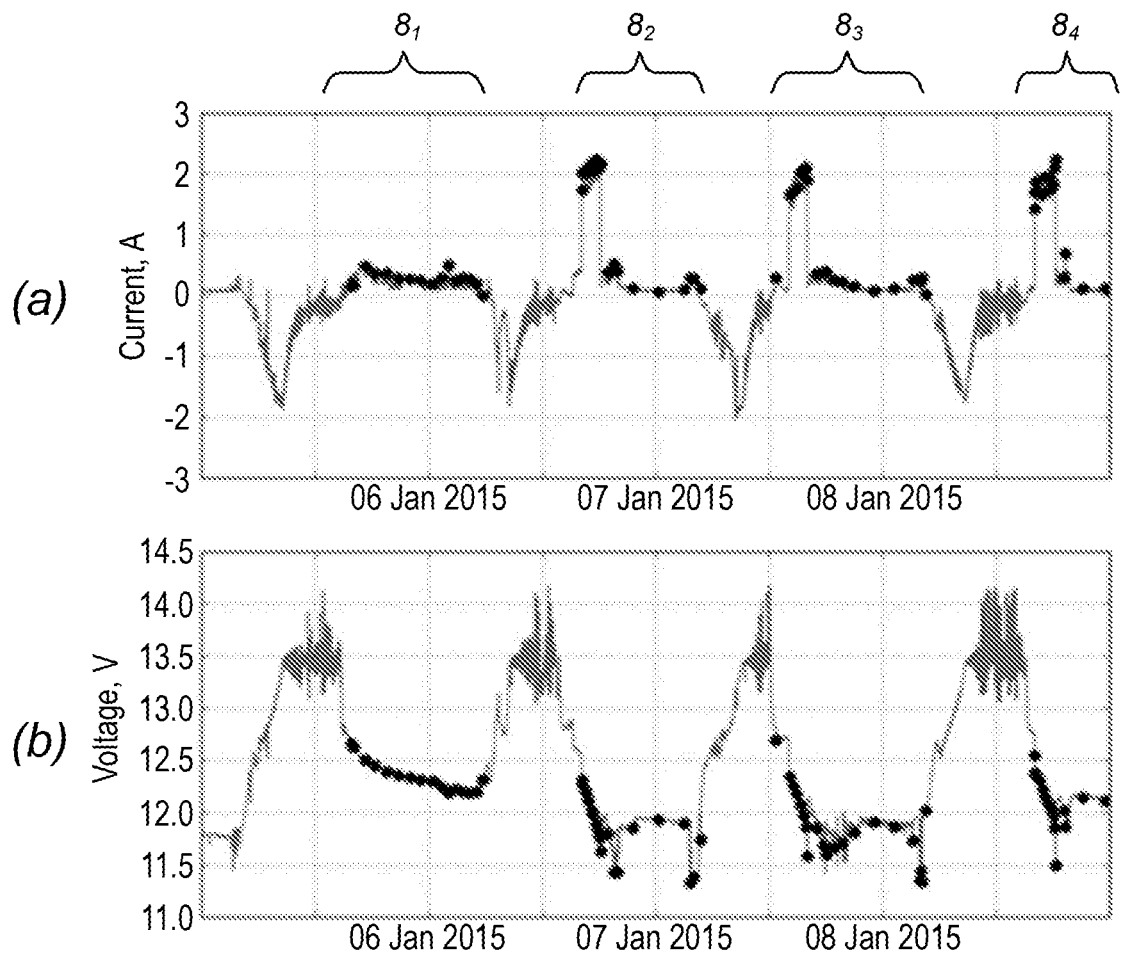
FIG. 7 shows examples of subsets of data ((a) current and (b) voltage versus time) prepared by the step of FIG. 6.

FIG. 7 shows an example of the selection of subsets of smart points (denoted by circles) from the received data (denoted by lines). The figure also illustrates subperiods $8_1, \ldots, 8_4$ corresponding to the subsets.

Battery Model

The battery model 4e, which, as explained above, is used by the SoH and SoC determination modules 4b, 4c, will now be described in more detail.

By way of non-limiting background information, there are three basic principles describing lead-acid batteries that underlie the battery model:
charge/discharge terminal voltage profiles, i.e. dependence of terminal voltage on SoC;
Peukert's law, which approximates capacity at different rates of discharge;
observed hysteresis, i.e. the observed dependence of $\Delta V$ on terminal current, wherein $\Delta V$ is the difference between the terminal voltage and the open circuit voltage.

An auxiliary model, i.e. a so-called bricks model, was developed to model these basic principles. The bricks model represents battery capacity as an empty rectangle when the battery is fully charged. As the battery is discharged, the rectangle begins to fill with bricks, wherein:
the size of each brick is proportional to the rate of discharge;
the bricks are placed at random in the space available in the rectangle; and
the bricks cannot overlap one another.

Figure 8:
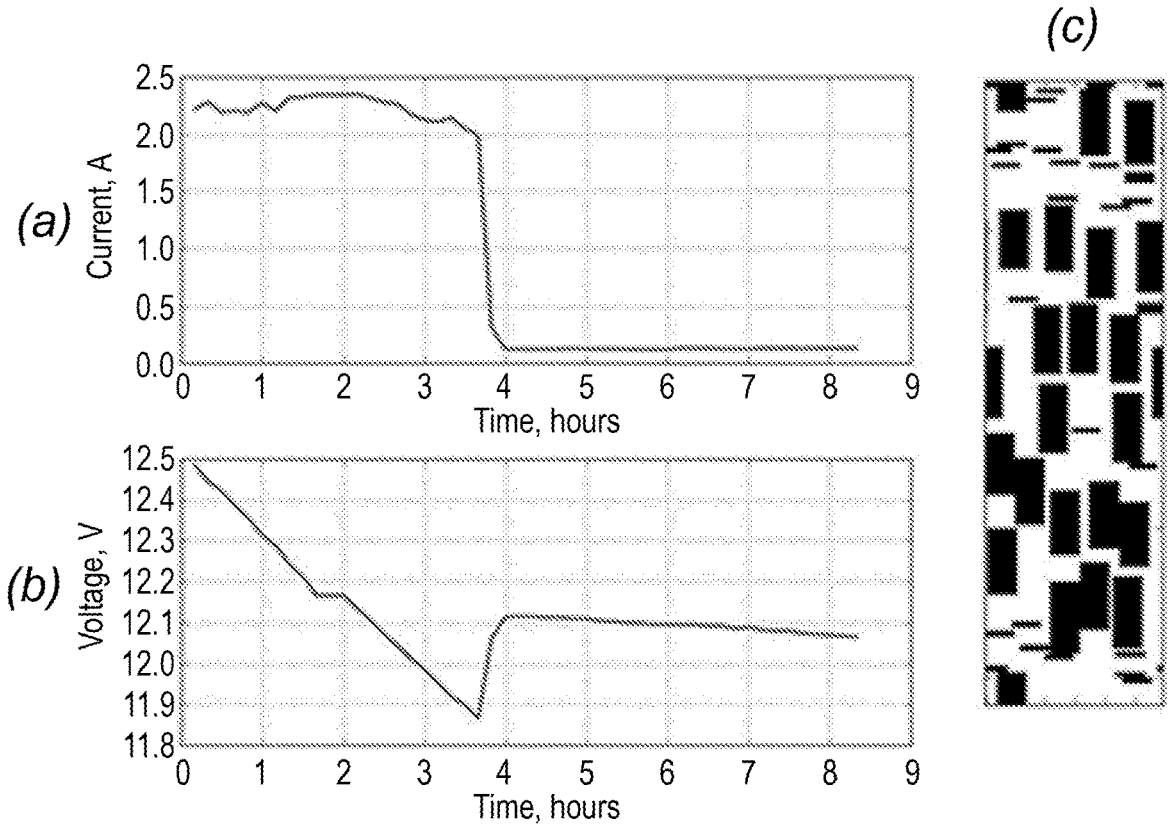
FIG. 8 shows examples of measured battery discharge data ((a) current and (b) voltage versus time) and a bricks model representation (c) resulting therefrom.

FIG. 8(c) shows an example bricks model representation resulting from the example discharge history shown in FIGS. 8(a) and (b).

The bricks model represents the idea that, in a lead-acid battery, the lead reacts with the acid as if the electrode surface(s) consists of domains whose activity (i.e. ability to react) depends on the terminal current. The higher this current, the lower the number of domains that are able to react.

There are several important results obtained from the bricks model.

Firstly, there is empty space between bricks that cannot be filled by certain bricks without overlapping—the larger the bricks, the more empty space remains unfilled. This empty space can be referred as inaccessible capacity. Inaccessible capacity depends on terminal current and this is analogous to Peukert's law.

In the bricks model, the available capacity depends only on the present rate of discharge, i.e. the battery has no memory and accordingly terminal voltage depends only on the present SoC and the present rate of discharge, not on the charging/discharging history.

Figure 9:
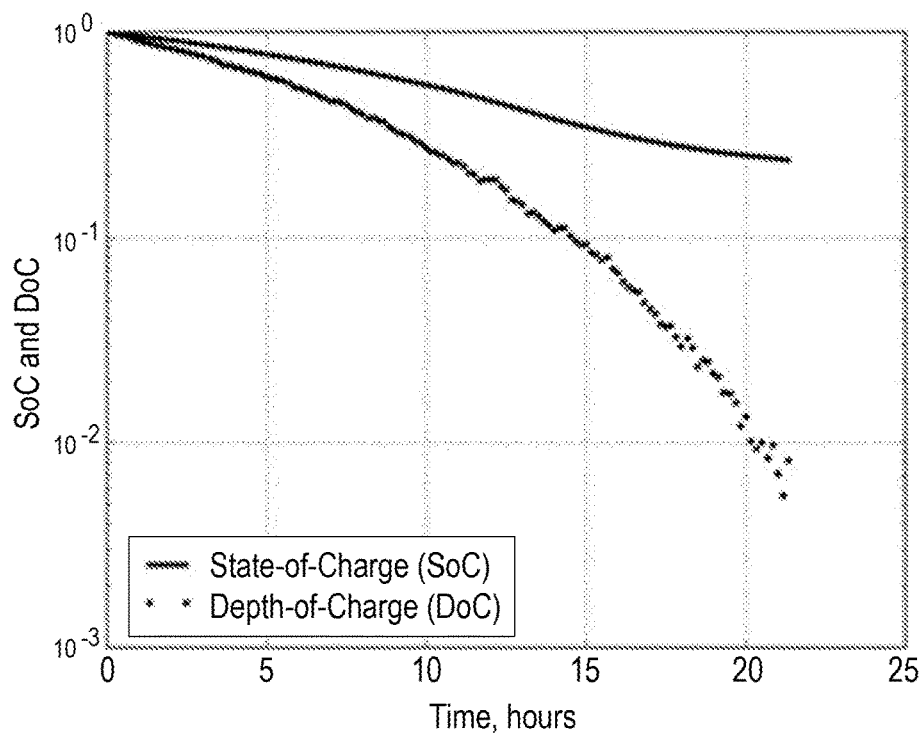
FIG. 9 shows examples of state of charge (SoC) and depth of charge (DoC) calculated using the bricks model.
Figure 10:
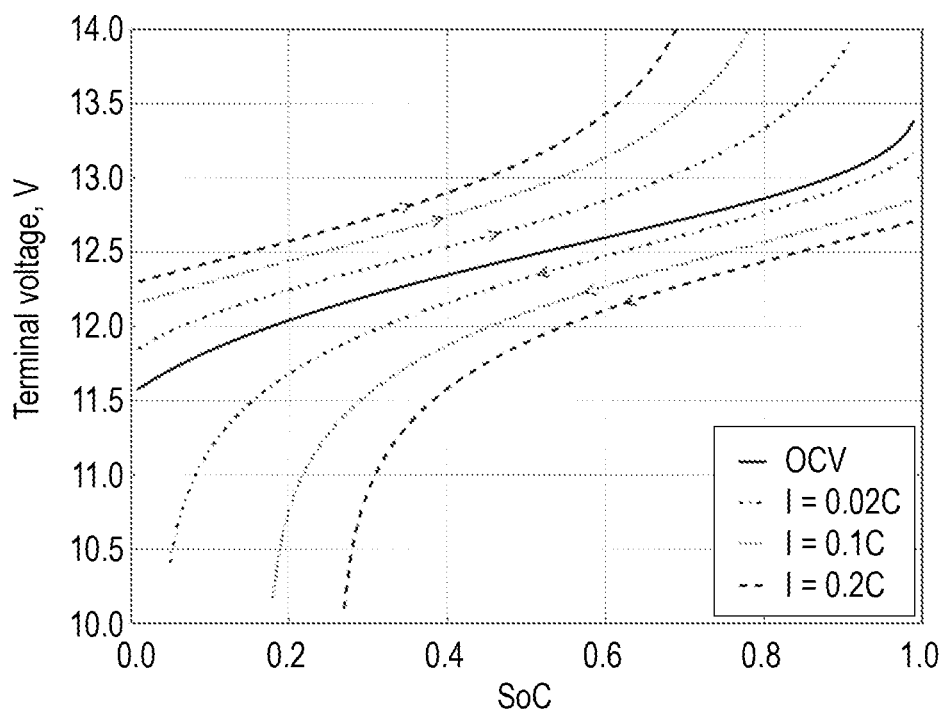
FIG. 10 shows examples of lead-acid battery charging/discharging curves at different values of terminal current (in C-rate units)

Secondly, the probability distribution of placing a brick in the rectangle versus the numbers of bricks already placed in the rectangle appears similar to the terminal voltage profile (see FIGS. 9 and 10). Here, the probability is defined as the ratio of the number of successful attempts at placing a brick to the total number of attempts. It is suggested that terminal voltage may have a probabilistic nature and may express the "entropy" of the charging/discharging process.

In the bricks model, SoC may be defined as the ratio of the area of empty space in the rectangle to the area of the rectangle. Depth of charge (DoC) may be defined as the abovedescribed probability of placing a brick in the rectangle. Accordingly, SoC represents the theoretically-available capacity, and DoC represents the actual capacity at a particular rate of discharge. There may be a significant difference between SoC and DoC in the bricks model, as shown in FIG. 9.

The battery model 4e used in certain embodiments of the present invention includes the abovedescribed concept of inaccessible capacity and formulae for terminal voltage profiles which will be described in more detail below.

The battery discharge process will be considered first.

Inaccessible capacity versus discharge current may be approximated by a suitable function such as a logarithm, chi-squared distribution with one degree of freedom, etc. In the following example, a logarithm-based function was used to fit manufacturer's data on battery capacity at different discharge rates:

$$\tilde{C}=\max(0,\alpha\times\ln(\beta+|I|)), \quad \text{(Eq. 4)}$$

where $\tilde{C}$ is the normalised inaccessible capacity (i.e. inaccessible capacity divided by the present theoretically-available capacity (e.g. capacity at a discharge current of ~0)), $\alpha$ and $\beta$ are (constant) parameters, and I is the discharge rate or, in other words, the current.

Then, an equivalent to Peukert's law can be written in the following form:

$$\frac{C}{C_0} = \frac{C^* - C^*\tilde{C}}{C_0^* - C_0^*\tilde{C}_0} = \frac{C^*}{C_0^*}\frac{1-\tilde{C}}{1-\tilde{C}_0} = \text{SoH} \times \frac{1-\alpha\times\ln(\beta+|I|)}{1-\alpha\times\ln(\beta+|I_0|)}, \quad \text{(Eq. 5)}$$

where C is the present capacity of the battery at a given current, $C_0$ is the nominal capacity of the battery, $I_0$ is the discharge current at which the nominal capacity of the battery was measured, $C^*$ is the present theoretically-available capacity and $C_0^*$ is the initial theoretically-available capacity, i.e. when the nominal capacity was measured and when, by definition, SoH=1.

The parameters $\alpha$ and $\beta$ can be found by fitting the abovedescribed manufacturer's data.

In the battery model 4e, it is assumed that terminal voltage depends on DoC rather than on SoC. As explained above, DoC=SoC−$\tilde{C}$ when the battery is discharging and SoC+$\tilde{C}$ when the battery is charging, which leads to the observed battery hysteresis.

If the electrical load changes, then terminal voltage relaxes to a new value or to the OCV if the load is disconnected. The relaxation time depends on the new terminal current value and may vary from several seconds to several hours (e.g. if I=0). For simplicity, relaxation is not included in the battery model 4e initially.

Terminal voltage profiles are introduced into the battery model 4e in the form of an adapted Nernst equation for one cell of a lead-acid battery (Atkins, P. et al., Physical Chemistry $8^{th}$ edition, Oxford University Press, 2006):

$$EMF = 2.041 + 0.0296\log_{10}\frac{\alpha(H^+)\alpha(SO_4^{2-})}{\alpha(H_2O)} \quad \text{(Eq. 6)}$$

where EMF is the electromotive force of the cell (in volts) and $\alpha$ is the relative activity of the corresponding reactant/product.

The ("activity") term $$\frac{\alpha(H^+)\alpha(SO_4^{2-})}{\alpha(H_2O)}$$

is replaced by a function of DoC to establish the link between terminal voltage and DoC assumed above. It is found that a logarithmic relationship between the activity term and 1−DoC provides a good fit to measured data. The terminal voltage (V) can thus be written as:

$$V=c_1+c_2\log_{10}(\log_{10}(1-\text{DoC})) \quad \text{(Eq. 7)}$$

where $c_1$ and $c_2$ are (constant) parameters. Typical values for the parameters are $c_1$=13 volts and $c_2$=1.2 volts. The parameters $c_1$ and $c_2$ can be considered as scaling parameters which may be useful in the case that the measurements of terminal voltage or current (i.e. the "battery voltage" and "battery current", respectively) by the battery system 2 are inaccurate e.g. due to a sensor miscalibration.

Terminal voltage has a nonlinear dependence on terminal current in the battery model 4e, rather than a linear dependence (via an internal resistance) as in some known battery models (Plett, 2004; Gould, 2009 (see above)).

The battery model 4e describes a charging process in a corresponding way to the discharging process. This is because a battery resists charging in the same manner as it does while discharging. For charging, the terminal voltage profile is inverted so that the terminal voltage tends to +∞ as SoC tends to 1. In relation to charging, inaccessible capacity means the capacity of the battery which cannot be charged at a given (non zero) charging current. Hence a battery can be fully charged only using a low charging current, at least at the final stage.

Accordingly, the following equations are obtained:

$$V_{discharge}=c_1+c_2\log_{10}(\log_{10}(1-\text{SoC}+\tilde{C})) \quad \text{(Eq. 8a)}$$

$$V_{charge}=c_3-c_2\log_{10}(\log_{10}(\text{SoC}+\tilde{C})) \quad \text{(Eq. 8b)}$$

Parameter $c_2$ is taken to be the same for both charging and discharging because both charging and discharging voltage profiles tends to the same OCV curve at low terminal currents.

Terminal voltage profiles calculated using equations 8a and 8b are shown in FIG. 10.

Equations 8a and 8b work particularly well if the diffusion process does not affect the terminal voltage. However, if the terminal current is close to zero, an additional correction is preferably included to approximate the value that the voltage relaxes to:

$$V_{discharge}=c_1+c_2\log_{10}(\log_{10}((\min(1\beta+|I|))(1-\text{SoC}+\tilde{C}))) \quad \text{(Eq. 9a)}$$

$$V_{charge}=c_3-c_2\log_{10}(\log_{10}((\min(1,\beta+|I|))(\text{SoC}+\tilde{C}))) \quad \text{(Eq. 9b)}$$

Figure 11:
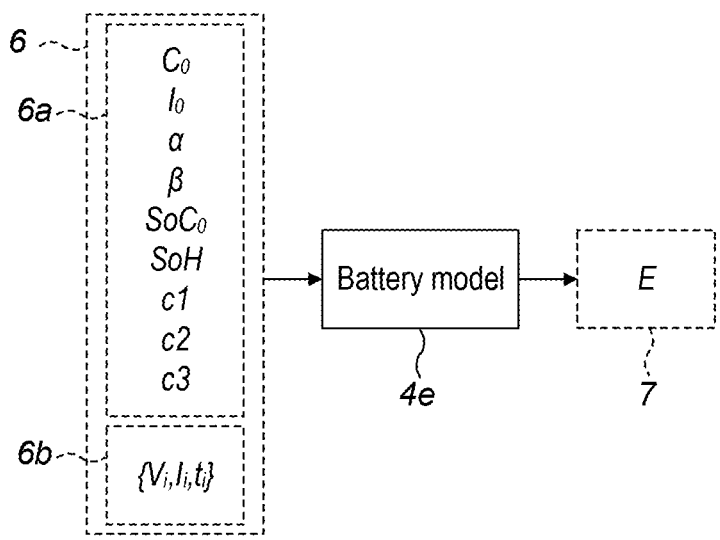
FIG. 11 illustrates use of the battery model in the state-of-health (SoH) determination and SoC determination steps of the method of FIG. 5.

Referring to FIG. 11, the battery model 4e in the form used by the SoH and SoC determination modules 4b, 4c will now be described in more detail.

The battery model 4e takes input data 6 and provides output data 7. The input data 6 includes battery model parameters 6a and a subset 6b. The battery model parameters 6a include:
- the nominal capacity $C_0$ and the associated discharge current $I_0$;
- the parameters $\alpha$ and $\beta$;
- the parameters $c_1$, $c_2$ and $c_3$ ($c_2$ or $c_3$ are not needed if the subset corresponds to a charge or a discharge, respectively)
- SoC at e.g. the beginning of each subperiod (SoC$_0$); and
- SoH which is preferably (but not necessarily) assumed to be constant throughout the subperiod of time corresponding to the subset 6b.

$C_0$, $I_0$, $\alpha$, $\beta$, $c_1$, $c_2$ and $c_3$ constitute the abovedescribed battery parameters 5d.

As mentioned above, $C_0$, $I_0$, $\alpha$ and $\beta$ are preferably predetermined constants (and so may be included within the battery model 4e).

The subset 6b includes a plurality of data points $\{V_i, I_i, t_i\}$.

The battery model 4e determines a charge transferred in or out of the battery at each data point e.g. $Q_i=I_i(t_i-t_{i-1})$ and converts this to a change in SoC ($\Delta$SoC) using:

$$\Delta SoC = \frac{Q}{C^*} = \frac{Q}{SoH \times C_0^*} = \frac{Q}{SoH \times C_0/(1-\tilde{C}_0)} = \frac{1-\alpha \times \ln(\beta + I_0)}{SoH \times C_0} \times Q, \quad \text{Eq. (12)}$$

where, as explained above, $C^*$ is the present theoretically-available capacity, which is related to SoH and the initial theoretically-available capacity and hence to $C_0$, $I_0$, $\alpha$ and $\beta$ (see equations 4 and 5).

Thus, using $SoC_0$ and the measured battery current and timestamp data, the battery model 4e determines SoC for each data point.

The battery model 4e then determines DoC=SoC$-\tilde{C}$ (discharging) or SoC$+\tilde{C}$ (charging) for each data point, wherein $\tilde{C}$ is determined using equation 4 and the measured battery current at the data point.

Using DoC for each data point, the battery model 4e then determines a predicted battery voltage for each data point, using equation 9a or 9b as appropriate.

The output data 7 corresponds to a value of an error associated with the predictions of the battery model 4e, e.g. the (mean of the) sum of the squares of the differences between the predicted and measured battery voltage data.

In other examples, the details of the battery model 4e may be different. For example, SoC may be provided at a different point in time in the subperiod, battery current may be predicted, etc.

SoH Versus Time Function

Simulations have shown that to obtain reliable estimation of SoH it is preferable to reduce the number of estimated parameters as much as possible. Accordingly, the SoH curve is preferably defined as a cubic spline, which allows optimisation of only a relatively small number of spline coefficients which determine the shape of the SoH curve and also defines a reasonable link (the continuity of the curve, and the first two derivatives) between SoH values at different dates.

In other examples, the SoH curve may be described by a different type of function, e.g. a polynomial function.

Furthermore, the SoH curve need not be described by a function per se. Instead, the SoH values may vary freely except that the changes of SoH between subsets may be limited by e.g. a cost function.

SoH Determination

Figure 12:
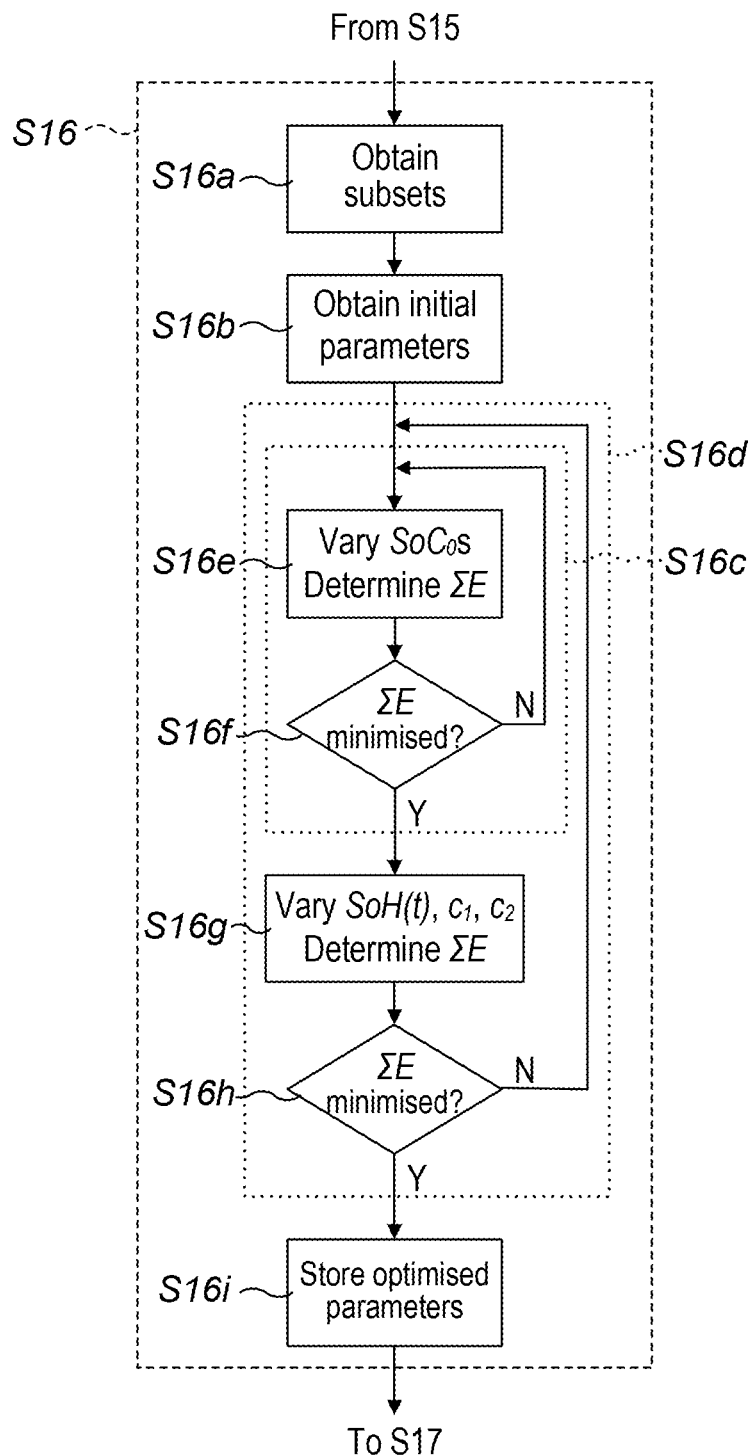
FIG. 12 illustrates the SoH determination step of the method of FIG. 5 in more detail.

Referring to FIG. 12, the sixth ("SoH determination") step S16 will now be described in more detail.

In brief, the server 3 (i.e. the SoH determination module 4b) optimises certain battery model parameters 6a and produces an SoH curve by minimising the errors associated with fitting the battery model 4e to a plurality of subsets. This is achieved using optimisation methods such as the L-BFGS-B algorithm as described, for example, in Byrd, R. H. et al, A Limited Memory Algorithm for Bound Constrained Optimization, SIAM Journal on Scientific and Statistical Computing, 16 (1995) 1190-1208.

At a first sub-step S16a, a plurality of ("relevant") subsets are obtained.

Initially, when an SoH curve is being started, the amount of information available is limited. Thereafter, the SoH curve may be updated using further subsets, but if the initial estimations are inaccurate, then they may take more subsets to correct.

There are at least two approaches to such a start:
a) using all available subsets to determine an SoH curve, which is computationally cheap; or
b) using just small number of (e.g. four or more) subsets to determine an SoH curve and then updating the SoH curve using the remaining subsets one by one, even if many subsets are available. This approach was found to be much more accurate than the first approach and so preferable.

When there is an existing SoH curve, the relevant subsets will preferably include all subsets since such a start (or a re-start as described below).

Preferably, the determination performed at the fifth step S15 is such that the number of relevant subsets is four or more at the first occurrence of the SoH determination step S16 (since a (re-)start) and increases by one or more between successive occurrences of the SoH determination step S16.

At a second sub-step S16b, initial battery model parameters 6a are obtained. The battery model parameters 6a includes the predetermined constants $C_0$, $I_0$, $\alpha$ and $\beta$, the scaling parameters $c_1$ and $c_2$ (which may have initial values or may have been optimised at a previous occurrence of the SoH determination step S16), an $SoC_0$ value for each of the relevant subsets (which may be initially set to any suitable predetermined value(s)) and an SoH value for each of the relevant subsets.

Initially, when an SoH curve is being created, these SoH values may be allowed to vary freely between subsets. Then, an SoH curve may be created to fit these SoH values. Then, the SoH curve may be updated by fitting the same subsets but with the SoH values calculated from the SoH curve (such that they are linked to each other and the spline penalties are applied, see below).

When there is an existing SoH curve, the SoH values included in the battery model parameters 6a are calculated from the SoH curve, e.g. from the spline coefficients and from timestamps associated with the relevant subsets, e.g. the beginning, middle or end of the corresponding subperiods.

The process of optimisation is performed in two loops, namely an inner loop 16c and an outer loop 16d.

The inner loop 16c optimises the $SoC_0$ values for all of the relevant subsets. Among other things, the outer loop 16d optimises e.g. the spline coefficients of the SoH curve and the parameters $c_1$ and $c_2$.

This is illustrated in the figure as follows:

At a third sub-step S16e, the $SoC_0$ values are varied and the sum of the battery model errors for the relevant subsets ($\Sigma E$) is determined. This is repeated until it is determined, at a fourth sub-step S16f, that $\Sigma E$ has been minimised (given the other non-varied parameters).

At a fifth sub-step S16g, the spline coefficients of the SoH curve (denoted by SoH(t) in the figure) and the parameters $c_1$ and $c_2$ are varied and the sum of the battery model errors for the relevant subsets ($\Sigma E$) is determined. This is repeated until it is determined, at a sixth sub-step S16h, that $\Sigma E$ has been minimised.

The outer loop S16d also preferably optimises the number and position of spline knots. There are competing requirements in relation to curve smoothness and details. Penalties may be added to control curve smoothness (see Hastie, T. J. et al, Generalized Additive Models, London: Chapman and Hall (1990). These include, for example, a penalty for the second derivative of the spline, and a penalty if any part of the SoH curve is below e.g. an SoC value (see FIG. 13). Curve details are controlled by the number and position of spline knots. According to Grebennikov, A. I., Method of splines and solution of ill-posed problems of approximation theory, Moscow: Izd-vo MGU (1983) (Russian), the asymptotically optimal grid spacing for cubic splines can be chosen by the following formula:

$$\tilde{h} = \varepsilon \times f'''(x)^{-\frac{1}{3}} \quad \text{(Eq. 13)}$$

where $\tilde{h}$ is the optimal time step (i.e. the next grid point should be placed at $x+\tilde{h}$), $\varepsilon$ is a parameter describing interpolation accuracy and $f'''$ is the third-derivative of the spline function. Such spacing will asymptotically improve curve approximation by splines by reducing the parameter $\varepsilon$. It follows that knot density is proportional to the third derivative of the (parts of the) spline function.

At a seventh sub-step S16$i$, the optimised parameters $c_1$ and $c_2$, (the parameters describing) the optimised SoH curve and the optimised $SoC_0$ values are stored.

Figure 13:
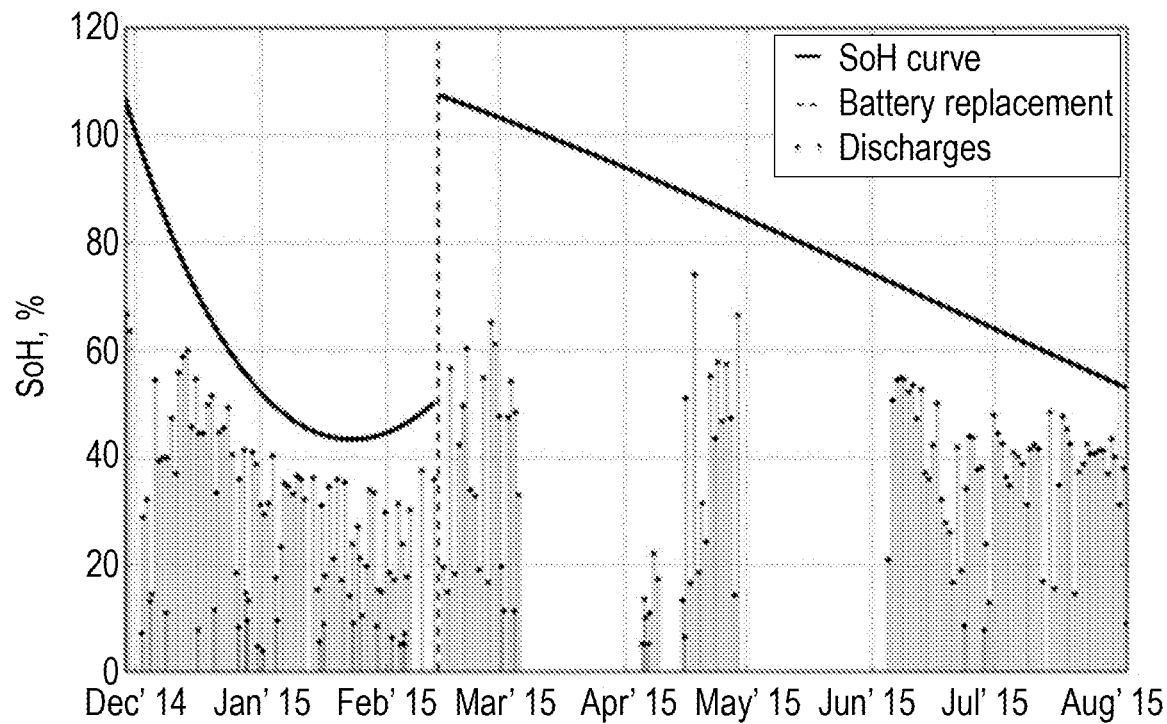
FIG. 13 shows examples of SoH versus time obtained by the step of FIG. 12.

FIG. 13 shows examples of SoH curves determined using the abovedescribed method from subsets represented in the figure by their (initial) SoC values.

As illustrated in FIG. 13, the server 3 is also preferably able to detect that the battery has been replaced, for example when the value and/or curvature of the SoH curve increases significantly between successive occurrences of the SoH determination step S16. In such circumstances, the server 3 starts a new SoH curve as explained above.

Furthermore, the server 3 also preferable starts a new SoH curve if there is no received data 5$a$ for a particular period of time (e.g. a number of months). Thus, errors which can accumulate with time may be avoided.

SoC Determination

Referring once again to FIG. 5, the ninth ("SoC determination") step S19 will now be described in more detail.

The step S19 involves determining SoC versus time and the parameter $c_3$ by using e.g. a particle filter to fit the battery model 4$e$ to some or all of the received data 5$a$, i.e. including charges and discharges. In doing so, the parameters $c_1$ and $c_2$, the SoH curve and the $SoC_0$ values determined at the SoH determination step S16 are used as part of the input data 6 for the battery model 4$e$. The particle filter is as described, for example, in Doucet, A. et al, A tutorial on particle filtering and smoothing: fifteen years later, Oxford Handbook of Nonlinear Filtering, 12 (2009) 656-704.

The determination of SoC versus time may be an important tool in monitoring charging problems of batteries and investigating reasons for battery SoH degradation.

Figure 14:
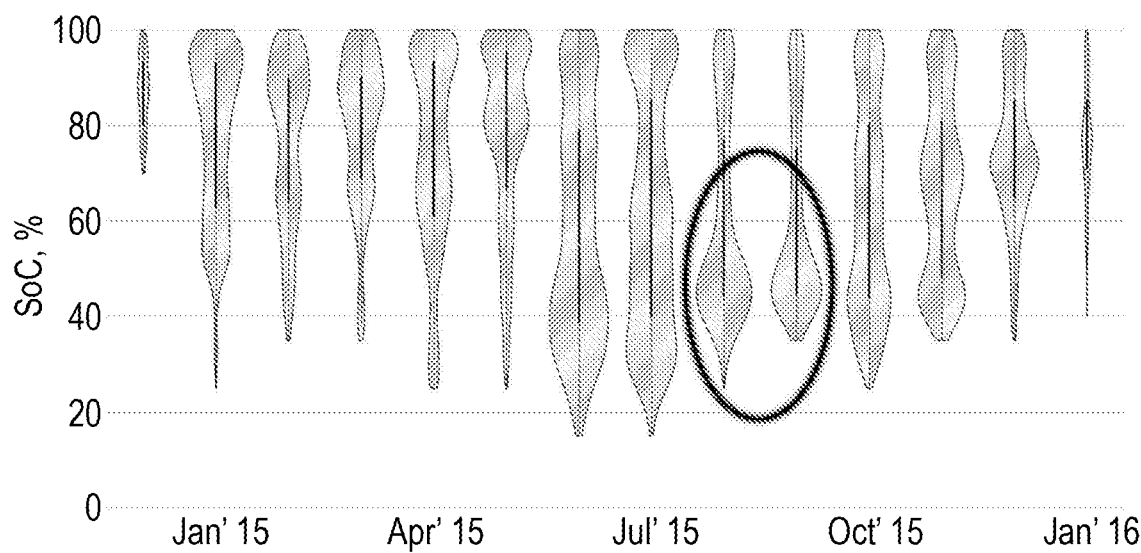
FIG. 14 shows examples of monthly distributions of SoC.

FIG. 14 shows examples of monthly distributions ("profiles") of SoC values. The thicker the profile, the more time spent by the battery at particular SoC values. The ellipse highlights two months when the battery experienced problems with charging.

Further Discussion

Further features and benefits of the abovedescribed system and methods include:

- the requirement for only historical telemetry battery current and voltage data;
- the ability to estimate both capacity/state-of-health and state of charge in an offline mode;
- that there is no need for any other external equipment;
- that there is no need to measure open circuit voltage and so batteries can be used without resting periods; and
- that the proposed battery model can be used on a unit in an online mode to control depth of discharge to prevent fast battery degradation.

Further Modifications

It will be appreciated that many other modifications may be made to the abovedescribed embodiments.

For example, the data need not be sent via the communications network 4 and may be provided from a battery system 2 to the server 3 in any suitable way.

Instead of a single computer as described above, the server 3 may correspond to a cloud computing system, a computer cluster, etc. The server 3 and the operator system 5 may be combined. The operator system 5 need not be included.

The method may be performed by the battery system itself.

Instead of providing an alert, some other action may be taken. For example, a record of an event or some other type of data may be stored.

The invention claimed is:

1. A computer-implemented method comprising:
   receiving a set of data from a battery, the set of data comprising battery voltage and current data obtained over a period of time;
   preparing a plurality of subsets of the set of data, wherein each subset corresponds to a subperiod of the period of time;
   determining a state of health of the battery versus time by fitting a battery model to the subsets, wherein the parameters of the battery model comprise:
      a state of charge of the battery at a particular point of time in each subperiod; and
      the state of health, wherein the time dependence of the state of health is controlled; and
   providing an alert in response to the state of health meeting a particular criterion,
   wherein preparing the subsets comprises selecting subsets corresponding to a discharge of at least a predetermined size;
   providing an alert comprises a server sending commands to a relevant battery system to modify its operations; and
   wherein the particular criterion corresponds to the state of health being below a predetermined value or a prediction that the state of health will go below the predetermined value.

2. A method according to claim 1, wherein preparing the subsets comprises preparing the subsets such that each of the subsets corresponds to a discharge of the battery.

3. A method according to claim 1, comprising preferentially selecting subsets that correspond to larger discharges than an average discharge represented by the data and/or that are more uniformly spaced from each other.

4. A method according to claim 1, wherein determining the state of health versus time comprises determining a set of parameters describing the state of health as a function of time.

5. A method according to claim 1, wherein the parameters of the battery model comprise a set of parameters of a function relating normalised inaccessible capacity of the battery to battery current.

6. A method according to claim 1, wherein the parameters of the battery model comprise a set of parameters of a function relating battery voltage to a depth of charge of the battery, wherein, for discharging, the depth of charge corresponds to the state of charge minus the normalised inaccessible capacity.

7. A method according to claim 1, wherein fitting the battery model to the subsets comprises:
   using an inner loop to determine at least the states of charge at the particular points of time; and
   using an outer loop to determine at least the state of health versus time.

8. A method according to claim 7, wherein using the outer loop comprises:
   determining one or more further parameters of the battery model; and/or
   determining a structure of a function describing the time dependence of the state of health, optionally the number and position of spline knots.

9. A method according to claim 1, comprising:
   determining a set of parameters describing the state of health as a function of time using a particular number of initial subsets; and then
   updating the parameters using at least one further subset.

10. A method according to claim 1, comprising:
    re-starting the determination of the state of health versus time in response to a predetermined criterion.

11. A method according to claim 1, comprising:
    determining the state of charge versus time by using a particle filter to fit the battery model to at least part of the set of data using the parameters of the battery model that were determined by fitting the battery model to the subsets.

12. A method according to claim 1, comprising using the particle filter to determine at least one parameter of the battery model that is related to charging of the battery.

13. A method according to claim 11, comprising:
    providing an alert in response to the state of charge versus time meeting a particular criterion.

14. A computer program for performing a method according to claim 1.

15. The method of claim 14, wherein the computer program is embodied on a non-transitory computer-readable medium.

16. An apparatus configured to perform a method according to claim 1.

17. The apparatus of claim 16, further comprising:
    one or more batteries; and
    a communications network configured to enable the apparatus to receive a set of data from each of the batteries.

* * * * *